United States Patent

Sonntag et al.

[11] 4,122,485
[45] Oct. 24, 1978

[54] METHOD AND APPARATUS FOR SIMULATING MAGNETIC ENVIRONMENT OF TELEVISION RECEIVERS

[75] Inventors: William Arthur Sonntag; Theodore Frederick Simpson, both of Lancaster, Pa.

[73] Assignee: RCA Corporation, New York, N.Y.

[21] Appl. No.: 783,215

[22] Filed: Mar. 31, 1977

[30] Foreign Application Priority Data

Sep. 30, 1976 [GB] United Kingdom ............... 40696/76

[51] Int. Cl.$^2$ ............................................. H04N 9/62
[52] U.S. Cl. ........................................ 358/10; 358/65; 315/370
[58] Field of Search ................. 358/10, 65; 315/13 R, 315/13 C, 13 CG, 370; 313/409, 415

[56] References Cited

U.S. PATENT DOCUMENTS

| 3,887,833 | 6/1975 | Yamazaki | 315/13 C |
| 3,916,437 | 10/1975 | Barbin | 358/10 |

Primary Examiner—John C. Martin
Attorney, Agent, or Firm—Eugene M. Whitacre; Paul J. Rasmussen; Joseph Laks

[57] ABSTRACT

A set of auxiliary deflection coils are placed on opposite sides of a multi-beam color television picture tube having a deflection yoke and color purity adjustment apparatus. The tube is operated to cause a raster to be scanned and the auxiliary coils are energized to cause the beams to be deflected from their nominal beam landing sites in predetermined direction and magnitude within each of at least two regions of the raster in order to simulate misregister caused by television receiver magnetic environment. Color purity is then adjusted in the presence of the simulated misregister.

8 Claims, 4 Drawing Figures

METHOD AND APPARATUS FOR SIMULATING MAGNETIC ENVIRONMENT OF TELEVISION RECEIVERS

BACKGROUND OF THE INVENTION

This invention relates to equipment for processing color television picture tubes and particularly to equipment for optimizing the color purity tolerance of these tubes by compensating for register changes or color purity errors caused by the magnetic environment present in the television receiver.

The three beams of a color television picture tube must be adjusted in position for several reasons to enable a satisfactory picture to be reproduced on the viewing screen of the tube. Adjustment for color purity is required with all color picture tubes. The purity adjustment provides for the beams to land only on their respective color phosphor elements. Obviously, if the displayed picture lacks purity, the red beam, for example, might land on green or blue phosphors and result in a false color scene reproduction.

In a non-matrix type of color picture tube, the beam portion passing through an aperture of the shadow mask is smaller than the individual phosphor element on the viewing screen so that when it is properly landed on the desired phosphor element, it will not illuminate the adjacent different color elements. In a matrix-type of picture tube, in which dark guard bands separate adjacent different color phosphor elements, the beam portion passing through an aperture may be larger than the phosphor element and still result in color purity. In both types of picture tubes it is desirable to center the respective beams on their phosphor elements to minimize the possibility of a loss of purity if the beams are undesirably moved due to temperature changes of the picture tube or stray magnetic fields.

It is generally recognized that purity may be controlled at the center portion of a viewing screen by varying the position of two magnetized purity rings mounted for rotatable motion about the neck of the picture tube. Purity is controlled at the edge regions of the picture tube by axial movement of the deflection yoke which moves the deflection center of the beams and hence controls their landing positions at portions away from the center of the viewing screen.

On method of adjusting color purity, using the purity rings and the deflection yoke, is disclosed in U.S. Pat. No. 3,916,437 issued to Barbin. Although this is an effective method for adjusting purity at the tube factory, misregister problems may arise after the picture tube has been installed in the television receiver. These problems are typically caused by the magnetic field environment present in the receiver which was not experienced during factory adjustment. These problems become particularly troublesome and expensive in those cases where the deflection yoke and purity rings are permanently immobilized after purity adjustment at the tube factory. In these situations, the receiver manufacturer must either install relatively expensive compensating circuitry in the receiver, or return the tube to the tube manufacturer taking the risk that the replacement tube may also develop purity errors.

One approach to solving these misregister problems involves simulating the magnetic environment of the receiver by placing pieces of metal at various locations around the deflection yoke. The size and location of the metal pieces are determined by trial and error until the misregister of the tube in the test system duplicates the misregister in the receiver. Since each type of receiver produced by each receiver manufacturer typically has its own unique magnetic field environment, it is apparent that simulating all possible receiver fields using pieces of metal is expensive, tedious and time consuming.

SUMMARY OF THE INVENTION

A method of simulating effects of magnetic field environment of a television receiver on a color television picture tube having at least two electron beams and a mosaic of recurring groups of luminescent deposits disposed on a screen. Each of the deposits are located at a nominal landing site of an associated electron beam on the screen. The method comprises the steps of placing a set of auxiliary deflection coils in predetermined spaced relation to the beams. The tube is operated to cause a raster to be scanned on the screen by at least one of the beams. The auxiliary coils are energized to cause the beam to be deflected from its nominal beam landing site by a predetermined amount in a predetermined direction within each of at least two predetermined regions of the raster, during at least one vertical field.

DETAILED DESCRIPTION OF THE INVENTION

The method disclosed herein comprises placing a deflection yoke and color purity adjustment apparatus in operating position relative to a multi-beam color television picture tube. A set of auxiliary deflection coils are placed on opposite sides of the picture tube. The tube is then operated to cause a raster to be scanned on the viewing screen of the tube. The auxiliary coils are energized to cause the beams to be deflected from their nominal beam landing sites by a predetermined amount in a predetermined direction within each of at least two predetermined regions of the raster. These predetermined deflections are chosen to approximate deflections which are likely to be caused by the magnetic environment present in the television receiver. Color purity of the tube is then adjusted using a prior art method such as that taught by U.S. Pat. No. 3,916,437 to Barbin.

Figure 1:
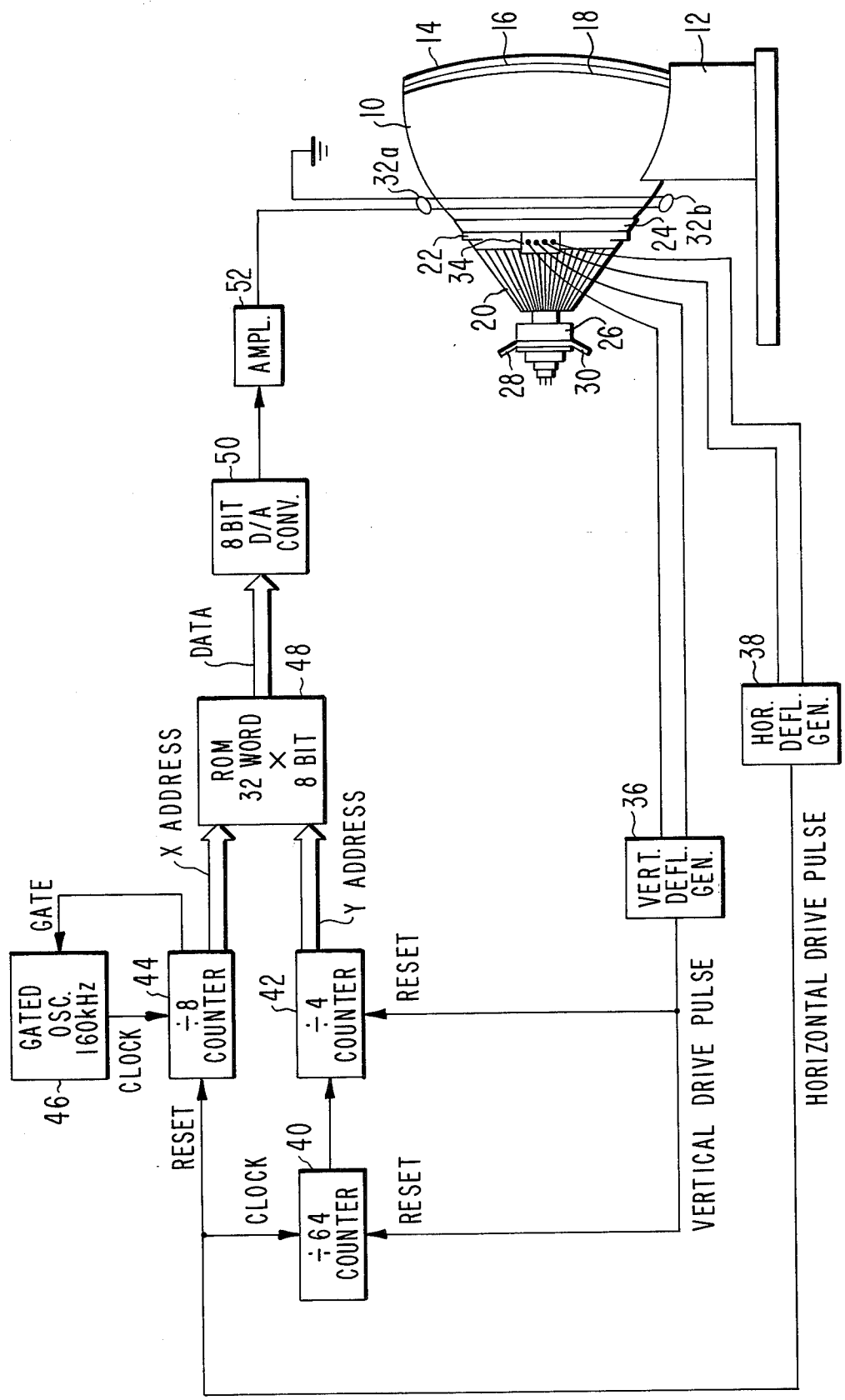
FIG. 1 is a combined side elevation view and functiional block diagram of one embodiment of an apparatus for simulating magnetic field effects in accordance with the invention.

FIG. 1 is a combined side elevation view and functional block diagram of a system for simulating register changes or purity errors caused by the magnetic environment presented by the television receiver. A color television picture tube 10 is fastened to a test fixture 12 by any suitable rigid attachment means. The picture tube 10 includes a viewing screen 14 having an inside surface on which are disposed a plurality of different colored phosphor elements 16. An aperture mask 18 is spaced a relatively short distance to the rear of the phosphor element 16 for allowing portions of the picture tube electron beams to pass through the apertures to strike their respective color phosphor elements.

A deflection yoke 20, comprising horizontal and vertical deflection coils, is fixed to a mounting member 22 which is in turn fitted against a mounting member 24 which is fixedly attached to the glass envelope of the picture tube 10. The mounting members are selected to allow for relative motion between the deflection yoke 20-mounting member 22 and mounting member 24. Any suitable arrangement for securing member 22 to member 24 when satisfactory position is achieved may be utilized. A static convergence assembly 26 is mounted about the neck portion of the picture tube 10 to the rear of the deflection yoke 20. Static convergence assembly 26, which may be of a known type, is utilized to converge the red, green and blue electron beams of the picture tube in the center region of viewing screen 14. To the rear of static convergence assembly 26 are disposed a pair of color purity adjusting rings 28 and 30. These rings are magnetized across a diameter of each ring so that rotation of the rings about the neck of the picture tube 10 will cause the three electron beams to move in the same direction.

Figure 2:
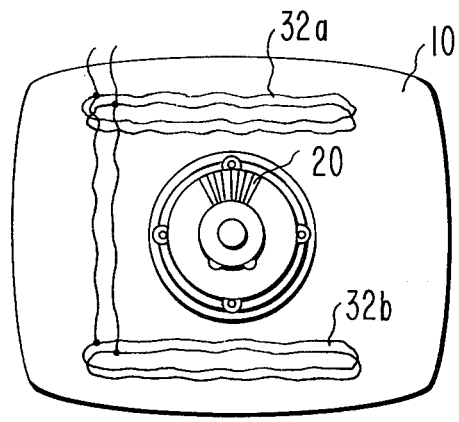
FIG. 2 is a partial rear view of FIG. 1 showing the operating relation of auxiliary deflection coils relative to a color picture tube in an arrangement for practicing the invention.

Disposed about the top and bottom portions of the picture tube 10 and fixedly mounted, by any suitable means, to the test fixture 12 are a pair of auxiliary deflection coils 32a and 32b. FIG. 2 is a partial rear view of FIG. 1 showing the operating relation of auxiliary deflection coils 32a and 32b relative to color picture tube 10. It can be seen that coils 32a and 32b extend in horizontal directions on opposite portions of the funnel portion of the picture tube 10. When energized, these deflection coils produce a vertical magnetic field which serves to shift the electron beams of the picture tube 10 in horizontal directions. The energizing current produces a magnetic field which shifts the beams to the left or to the right depending upon the direction of energizing current flow. The magnetic field produced by coils 32a and 32b is in addition to the normal deflection field produced by the deflection coils of deflection yoke 20.

The horizontal and vertical deflection coils of the deflection yoke 20 are electrically connected to terminals on a terminal board 34. A vertical deflection generator 36 provides scanning current at the vertical deflection rate (60 Hz) and is coupled to the terminal board 34 for energizing the vertical deflection coils. A horizontal deflection generator 38 provides scanning current at a horizontal deflection rate (15,750 Hz) and is coupled to terminal board 34 for providing scanning current for the horizontal deflection coils.

As previously stated, the method disclosed herein includes simulating receiver magnetic environment by deflecting the beams in accordance with predetermined magnitude and direction in each of at least two predetermined regions of the raster. Measurements at various locations on the viewing screen have shown that magnitude and direction of beam deflection from the nominal landing site due to receiver environment may, and generally does, vary from location to location throughout the viewing area. Consequently, any meaningful simulation of this misregister causing environment should also cause beam landing displacement in more than one location. In fact, the simulation of highest fidelity would require duplication of beam landing error at every beam landing site. Since the number of sites in a color television picture tube is in the order of 1,000,000, absolute fidelity is impractical and, since the difference in error between adjacent sites is minimal, unnecessary. In the preferred embodiment disclosed herein, 32 regions, having discrete beam landing errors associated therewith, have been chosen as a practical approximation.

Figure 3:
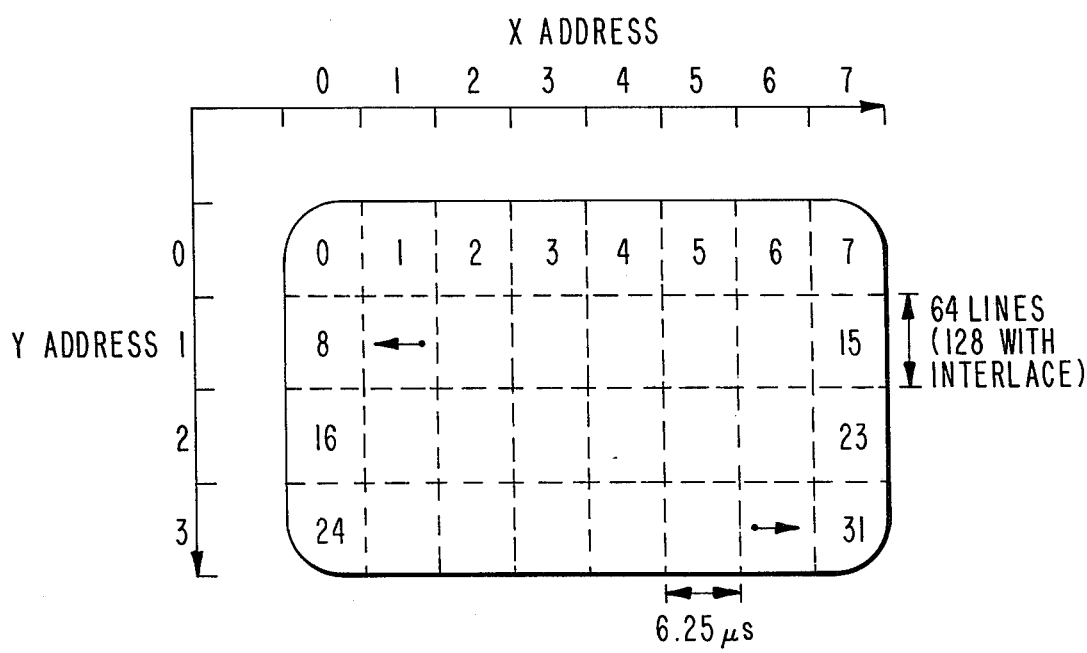
FIG. 3 is a front view of the picture tube showing the viewing screen schematically divided into 32 discrete regions.

FIG. 3 is a front view of the picture tube 10 showing the viewing screen 14 schematically divided into an 8 × 4 matrix of 32 discrete regions. Magnitude and direction of beam landing error is programmable within each region, independent of the other regions. Electronic division of the raster into these regions is accomplished as follows. Each horizontal line time is substantially equal to 63 microseconds including 50 microseconds for horizontal scan and 13 microseconds for retrace. Consequently, eight discrete regions in the horizontal or X direction would require a change every 6.25 microseconds. Also, since there are approximately 256 horizontal lines scanned per vertical field, four discrete regions in the vertical or Y direction would require a change every 64 lines. Note that depending on such things as vertical retrace time and utilization of a number of lines for transmitted reference signals, the actual number of scan lines could be on the order of 225 per vertical field. In this case four regions in the vertical or Y direction, each having a substantially equal number of lines, would require a change every 56 lines. However, it should be noted that it is not mandatory that each region contain an equal number of lines; consequently, for a field containing 225 lines, a change every 64 lines would still fall within the scope of the present invention.

Referring again to FIG. 1, the vertical deflection generator 36 outputs a vertical drive pulse at the beginning of each vertical field. This vertical drive pulse is coupled to a ÷64 counter 40 and a ÷4 counter 42. The vertical drive pulse functions to reset the ÷64 and ÷4 counters at the beginning of each vertical field. The horizontal deflection generator 38 outputs a horizontal drive pulse at the beginning of each horizontal line. This horizontal drive pulse is coupled to the ÷64 counter 40 and a ÷8 counter 44 having a three-bit binary coded output. The horizontal drive pulse functions as a clock input to the ÷64 counter 40 and serves to reset the ÷8 counter 44 at the beginning of each horizontal line. The ÷64 counter 40 outputs a clock pulse to the ÷4 counter 42 once every 64 clock input pulses. The output of a gated oscillator 46 is coupled to the ÷8 counter 44. The oscillator frequency is 160 KHz and the output functions as a clock input to the ÷8 counter 44, causing the binary coded output of the counter to change state every 6.25 microseconds. The ÷8 counter 44 outputs a gate pulse which gates the 160 KHz oscillator 46 on starting at the time the ÷8 counter 44 is reset and ending when the ÷8 counter has reached the 8th count.

The ÷8 counter outputs a three-bit binary coded signal over three lines to a 32 word by eight-bit read only memory (ROM) 48. The three-bit binary coded signal forms the X address portion of the five-bit address input to the ROM 48. The ÷4 counter 42 outputs a two-bit binary coded signal over two lines to the ROM 48. The two-bit binary coded signal forms the Y address portion of the five-bit address input to the ROM 48. The ROM 48 outputs an eight-bit binary coded data word over eight lines to an eight-bit digital-to-analog (D/A) converter 50. The most significant bit of the eight-bit data word determines the sign of the D/A output while the remaining seven bits determines the magnitude. The output of the D/A converter 50 is coupled to a power amplifier 52. The power amplifier 52 supplies current to the auxiliary deflection coils 32a and 32b.

Prior to operation of the system, the ROM is programmed in a conventional manner (see Harris Semiconductor Catalog, August 1975, pages Me-55 through Me-57), in order to place the proper data in each memory location. This data is obtained by adjusting a test picture tube for substantially zero misregister in a known or field free magnetic environment. The tube is then placed in a receiver and both are placed in the calibrated magnetic environment and beam landing error is measured at each of the 32 regions in the raster area. Since the magnitude and direction of energizing current in the auxiliary deflection coils 32a and 32b which would cause similar beam landing errors is known, the corresponding digital data is programmed into each memory location of the ROM. For example, if the beam landing error is measured to be 1 mil to the left in location 9 (01001) and it is known that digital data word 10010000 will produce a 1 mil shift to the left, then 1001000 will be programmed into location 01001 in the ROM.

After programming has been completed, the tube is energized and a raster is scanned continuously. Two of the three beams are cut off, for example, the blue and green beams, leaving only the red field. The counters 40, 42 and 44 are reset or initialized at the start of each vertical field scan by the horizontal and vertical drive pulses. The ÷8 counter 44 and the ÷4 counter 42 together output a five-bit address word (for example 00000) to the ROM 48 which outputs the data word at that address (for example 10000101) to the D/A converter 50. The D/A converts the digital data word to an analog signal which is coupled to the power amplifier 52. The power amplifier 52 provides an energizing current to the auxiliary coils 32a and 32b, the magnitude and direction of which is a function of the eight-bit data word located in the ROM address 00000.

6.25 microseconds later, the output of the ÷8 counter 44 changes state to, for example 001, causing the five-bit address word input to the ROM 48 to become 00001. In order words, the X address is advanced by one count and the Y address remains unchanged. The ROM will then output the eight-bit data word which has been preprogrammed into memory location 00001, causing the power amplifier to energize the auxiliary deflection coils in accordance with the data stored at that location. The X address continues to advance by one each 6.25 microseconds until it reaches seven (111), at which time the ÷8 counter 44 gates the oscillator 46 off. At the beginning of the next horizontal line, the ÷8 counter is reset and the process repeats itself. Since the ÷4 counter output remains unchanged for 64 lines, the Y address remains unchanged and address locations 00000 to 00111 are repeated for 64 horizontal lines. After the 64th line has been scanned, the ÷64 counter outputs a clock pulse which advances the ÷4 counter. Consequently, at the beginning of the 65th horizontal line scan, the Y address is advanced by one and the five-bit address word is, for example, 01000. The X address locations are advanced eight times each horizontal line for 64 lines while the new Y address remains unchanged. This causes the induced beam landing error to remain substantially constant within each region defined by one-eighth of a scan line in the horizontal direction and 64 lines in the vertical direction. The beam landing error changes from region to region depending upon the data program in the corresponding ROM address. The end result is that the raster is effectively divided into 32 regions, each of which has an independently programmed beam landing error. With the desired beam landing errors introduced, color purity is now adjusted in accordance with the prior art technique.

The aforementioned procedure is repeated for the blue field (red and green beams cut-off), the green field (red and blue beams cut-off) and the white field (all beams on). It is possible that a skilled operator might be able to adjust color purity in accordance with this method using only the white field or the red field for example. It should be noted that the use of one or more fields, or any combination thereof, is considered to fall within the scope of the present invention. Adjusting color purity in the presence of receiver induced beam landing errors introduced in accordance with this invention, will minimize color purity errors in the finished television receiver.

While the foregoing has been described in accordance with U.S. Television Standards, European or other television standards can be accommodated by making appropriate changes in the numerical values of the counters and in the oscillator frequency.

Figure 4:
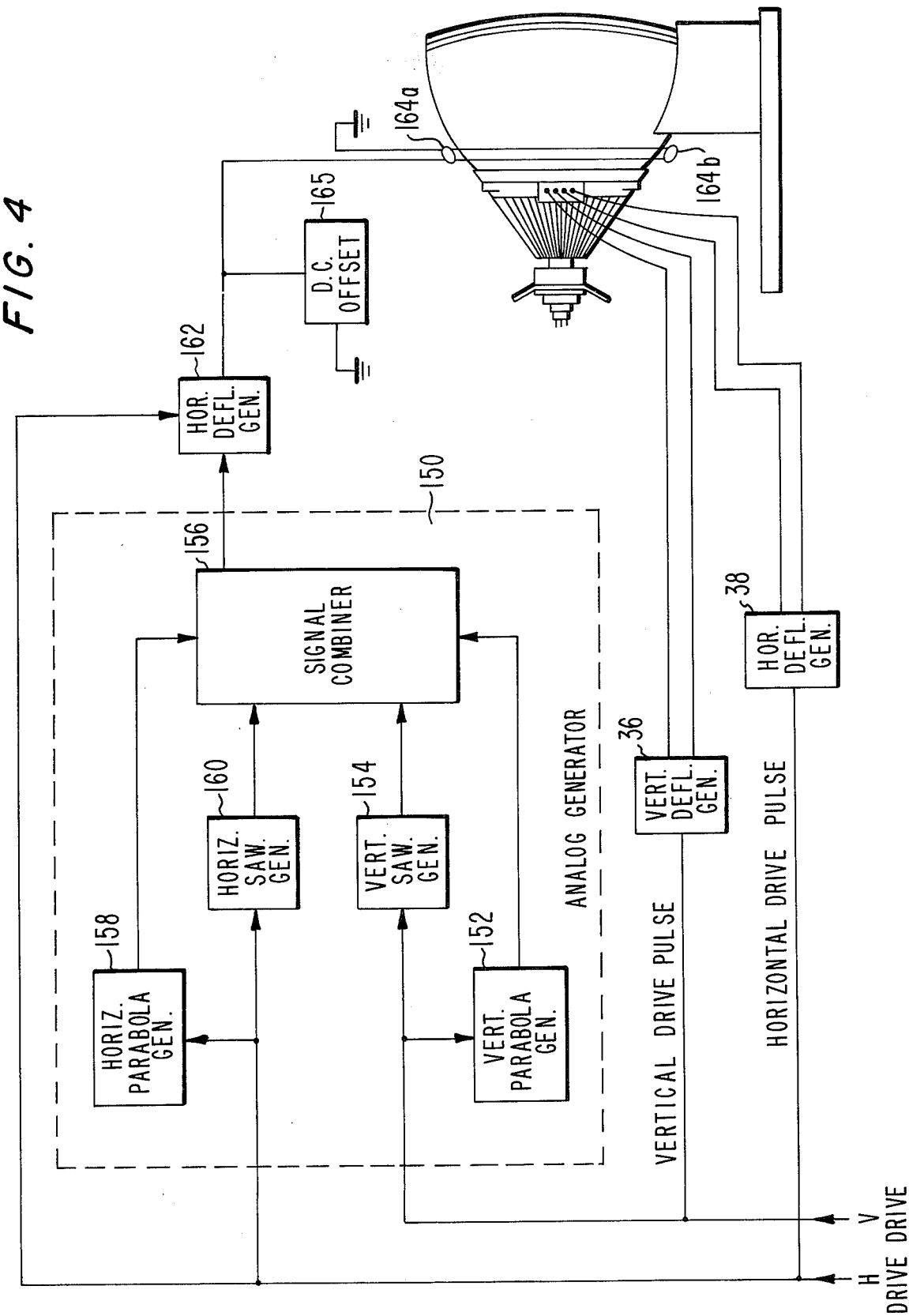
FIG. 4 is a combined side elevation view and functional block diagram of an alternate embodiment of an apparatus for simulating magnetic field effects in accordance with the invention.

FIG. 4 is another embodiment of apparatus for practicing the invention which apparatus is similar to that of FIG. 1 except that the digital auxiliary coil scanning current generator of FIG. 1 has been replaced by an analog signal generator for performing essentially the same purpose.

Vertical and horizontal drive pulses obtained from vertical and horizontal deflection generators 36 and 38 are coupled to an analog generator 150. The vertical rate pulses are coupled to a vertical parabolic generator 152, a vertical sawtooth generator 154 and a signal combiner 156. The horizontal rate pulses are coupled to a horizontal parabolic generator 158, a horizontal sawtooth generator 160 and a signal combiner 156. Output signals in the form of vertical and horizontal rate parabolic and sawtooth waveforms are coupled from generators 152, 154, 158 and 160 to signal combiner 156. The parabolic and sawtooth generators may be of any suitable type such as the type conventionally used for producing these type waveforms which are utilized for pincushion correction and convergence correction in television receivers. Signal combiner 156 may be conventional circuitry for allowing selective combining of any two or more of the input waveforms coupled thereto. Thus, the output signal obtained from signal combiner 156 is suitable for driving amplifier 162 which is typically a quasi-tuned nonlinear horizontal deflection driver and in turn produces a required scanning current so timed in relation to the vertical and horizontal scanning intervals as to produce a desired magnetic field to be generated by the auxiliary coils 164a and 164b. A dc offset current (165) is introduced to provide static shifts often required for earths field variations and to aid in centering the waveforms of current produced by the scanning amplifier. Such a field can produce the desired register condition of the beams in a selected location on the picture tube viewing screen as described in conjunction with FIG. 3. By way of example, the input signals coupled to signal combiner 156 may be selected and combined for producing a signal only in a top portion of the picture tube viewing screen and then only on the righthand side of the viewing screen. Such a signal would be generated by utilizing a vertical rate signal occurring during the first half portion of each vertical deflection interval and a horizontal rate signal occurring during a second half portion of each horizontal deflection cycle. Thus, the FIG. 4 embodiment can be utilized to produce similar effects compared to the apparatus described in FIG. 1.

We claim:

1. A method of simulating effects of magnetic field environment of a television receiver on a color television picture tube having at least two electron beams and a mosaic of recurring groups of luminescent deposits disposed on a screen, each of said deposits being located at a nominal landing site of an associated electron beam on said screen, said method comprising the steps of:
    (a) placing a set of auxiliary deflection coils in predetermined spaced relation to said beams;
    (b) operating said tube to cause a raster to be scanned on said screen by at least one of said beams; and
    (c) energizing said auxiliary coils to cause said beam to be deflected from its nominal beam landing site by a predetermined amount in a predetermined direction within each of at least two predetermined regions of said raster, during at least one vertical field, said predetermined amount being selected in accordance with said magnetic field.

2. The method in accordance with claim 1 wherein said color television picture tube includes a multi-beam electron gun assembly which generates three in-line electron beams and wherein each recurring group of luminescent deposits comprises three different color emitting vertical phosphor strips which are in substantially parallel spaced relation to each other and substantially perpendicular to the direction of electron beam scanning and in which step (c) comprises deflecting said beam to the left of its nominal beam landing site by a predetermined amount within predetermined ones of 32 regions of said raster of substantially equal areas arranged in an 8 × 4 matrix array and deflecting said beam to the right of its nominal beam landing site by a predetermined amount within predetermined others of said 32 regions.

3. The method in accordance with claim 2 wherein step (b) comprises operating said tube to cause a raster to be scanned on said screen by all three of said beams and including additional steps as follows:
    (d) switching off a second and third of said three in-line beams, operating said tube to cause a raster to be scanned on said screen by a first of said beams, and repeating step (c);
    (e) switching off said first and third beams, operating said tube to cause a raster to be scanned on said screen by said second beam, and repeating step (c); and
    (f) switching off said first and second beams, operating said tube to cause a raster to be scanned on said screen by said third beam, and repeating step (c).

4. A method of simulating effects of magnetic field environment of a television receiver on color purity of a color television picture tube having an in-line, three beam electron gun assembly, a mosaic of recurring groups of three different color emitting strips disposed on a screen in substantially parallel spaced relation to each other and substantially perpendicular to a direction of electron beam scanning, each of said three different color emitting phosphor strips being located at a nominal landing point of an associated electron beam on said screen, said method comprising the steps of:
    (a) placing a deflection yoke and color purity adjustment apparatus in operating positions relative to said color picture tube;
    (b) placing a set of auxiliary deflection coils in predetermined spaced relation to said beams;
    (c) switching off the two outside ones of said three in-line beams and operating said tube to cause a raster to be scanned by the remaining beam;
    (d) energizing said auxiliary coils to cause the beam to be deflected to the left of its nominal beam landing site by a predetermined amount within predetermined ones of 32 regions of substantially equal areas arranged in an 8 × 4 matrix array and deflecting said beam to the right of its nominal beam landing site by a predetermined amount within predetermined other of said 32 regions during at least one vertical field;
    (e) adjusting said color purity apparatus and the axial position of said deflection yoke in order to minimize excursion of said beam from its nominal beam landing site into adjacent color emitting strips;
    (f) repeating steps (d) and (e) for each of the two other beams; and
    (g) operating said tube to cause a raster to be scanned on said screen by all three of said beams and repeating steps (d) and (e).

5. An apparatus for simulating effects of magnetic field environment of a television receiver on a color television picture tube having at least two electron beams and a mosaic of recurring groups of luminescent deposits disposed on a screen, each of said deposits being located at a nominal beam landing site of an associated electron beam on said screen, said apparatus comprising:
    (a) mounting means for holding said color picture tube and a deflection yoke, in operation relationship relative to said picture tube;
    (b) a pair of auxiliary deflection coils mounted on said mounting means to be on opposite sides of said picture tube;
    (c) means for energizing said deflection yoke at normal field and line deflection rates for scanning a raster on said screen with at least one of said electron beams; and
    (d) means for energizing said auxiliary coils to cause the beam to be deflected from its nominal beam landing site by a predetermined amount in a predetermined direction within each of at least two predetermined regions of said raster, during at least one vertical field, said predetermined amount being selected in accordance with said magnetic field.

6. An apparatus in accordance with claim 5 wherein said color television picture tube includes a multi-beam electron gun assembly which generates three in-line electron beams and wherein each recurring group of luminescent deposits comprises three different color emitting vertical phosphor strips which are in substantially parallel spaced relation to each other and substantially perpendicular to the direction of electron beam scanning and in which said means for energizing said auxiliary coils causes the beam to be deflected in the direction of electron beam scanning by a predetermined amount within predetermined ones of said regions and in a direction opposite to electron beam scanning by a predetermined amount within predetermined others of said regions.

7. An apparatus in accordance with claim 6 wherein said raster encompasses 32 regions of substantially equal areas arranged in an 8 × 4 matrix array.

8. An apparatus for simulating effects of magnetic field environment of a television receiver on color purity of a color television picture tube having an in-line, three beam electron gun assembly, a mosaic of recurring groups of three different color emitting phosphor strips disposed on a screen in substantially parallel spaced relation to each other and substantially perpendicular to a direction of electron beam scanning, each of said three different color emitting phosphor strips being located at a nominal landing point of an associated electron beam on said screen, said apparatus comprising:

(a) mounting means for holding said color picture tube and a color purity adjustment assembly and deflection yoke in operating relationship relative to said picture tube;

(b) a pair of auxiliary deflection coils mounted on said mounting means to be on opposite sides of said picture tube;

(c) means for switching off said electron beams and operating said tube to cause a raster to be scanned on said screen by at least one electron beam;

(d) means for energizing said auxiliary coils to cause the beam to be deflected from its nominal beam landing site in the direction of beam scanning by a predetermined amount within predetermined ones of 32 regions of said raster, said regions being of substantially equal areas arranged in an 8 × 4 matrix array, and to cause the beam to be deflected from its nominal beam landing site in a direction opposite to electron beam scanning by a predetermined amount within predetermined others of said regions during at least one vertical field; and (e) means for adjusting said color purity apparatus and the axial position of said deflection yoke in order to minimize excursion of said beam from its nominal beam landing site into adjacent color emitting strips.

* * * * *